US009444014B2

(12) United States Patent
Schubert et al.

(10) Patent No.: US 9,444,014 B2
(45) Date of Patent: *Sep. 13, 2016

(54) SOLID STATE LIGHTING DEVICES WITH ACCESSIBLE ELECTRODES AND METHODS OF MANUFACTURING

(71) Applicant: Micron Technology, Inc., Boise, ID (US)

(72) Inventors: Martin F. Schubert, Boise, ID (US); Vladimir Odnoblyudov, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/614,247

(22) Filed: Feb. 4, 2015

(65) Prior Publication Data

US 2015/0144986 A1    May 28, 2015

Related U.S. Application Data

(63) Continuation of application No. 13/926,799, filed on Jun. 25, 2013, now Pat. No. 9,000,456, which is a continuation of application No. 12/970,726, filed on Dec. 16, 2010, now Pat. No. 8,476,649.

(51) Int. Cl.
*H01L 29/18* (2006.01)
*H01L 33/38* (2010.01)
*H01L 33/36* (2010.01)

(52) U.S. Cl.
CPC ............. *H01L 33/382* (2013.01); *H01L 33/36* (2013.01); *H01L 33/387* (2013.01)

(58) Field of Classification Search
CPC ...... H01L 33/26; H01L 33/36; H01L 33/382

USPC ............. 257/88–103, E33.023, E33.032, 257/E33.034

See application file for complete search history.

(56) References Cited

U.S. PATENT DOCUMENTS 8,476,649 B2 *   7/2013   Schubert et al. ............... 257/88
2007/0114545 A1   5/2007   Jang et al.

(Continued)

FOREIGN PATENT DOCUMENTS

CN    201252111 Y   6/2009
CN    101771125 A   7/2010

(Continued)

OTHER PUBLICATIONS

International Search Report and Written Opinion for International Application No. PCT/US2011/061309, mailed May 30, 2012, 7 pages.

(Continued)

*Primary Examiner* — Brook Kebede
(74) *Attorney, Agent, or Firm* — Perkins Coie LLP

(57) ABSTRACT

Various embodiments of light emitting dies and solid state lighting ("SSL") devices with light emitting dies, assemblies, and methods of manufacturing are described herein. In one embodiment, a light emitting die includes an SSL structure configured to emit light in response to an applied electrical voltage, a first electrode carried by the SSL structure, and a second electrode spaced apart from the first electrode of the SSL structure. The first and second electrode are configured to receive the applied electrical voltage. Both the first and second electrodes are accessible from the same side of the SSL structure via wirebonding.

12 Claims, 8 Drawing Sheets

(56) References Cited

U.S. PATENT DOCUMENTS

| | | |
|---|---|---|
| 2008/0048206 A1 | 2/2008 | Lee et al. |
| 2008/0142824 A1 | 6/2008 | Chen et al. |
| 2009/0101923 A1 | 4/2009 | Choi et al. |
| 2009/0152583 A1 | 6/2009 | Chen et al. |
| 2010/0038674 A1 | 2/2010 | Chen et al. |
| 2010/0096652 A1 | 4/2010 | Choi et al. |
| 2010/0148189 A1 | 6/2010 | Fang et al. |
| 2010/0163904 A1 | 7/2010 | Park et al. |
| 2010/0171135 A1* | 7/2010 | Engl et al. ............ 257/98 |
| 2010/0201280 A1 | 8/2010 | Mckenzie et al. |
| 2010/0219426 A1 | 9/2010 | Kim et al. |
| 2010/0314643 A1* | 12/2010 | Lin ....................... 257/98 |
| 2011/0204402 A1 | 8/2011 | Jeong et al. |
| 2012/0153304 A1 | 6/2012 | Schubert et al. |
| 2013/0202078 A1 | 8/2013 | Lee et al. |
| 2013/0285107 A1 | 10/2013 | Schubert et al. |
| 2015/0001463 A1 | 1/2015 | Choi et al. |

FOREIGN PATENT DOCUMENTS

| | | |
|---|---|---|
| JP | 2003243708 A | 8/2003 |
| JP | 2003243709 A | 8/2003 |
| KP | 100999784 B1 | 12/2010 |
| KR | 1020100044726 A | 4/2010 |
| KR | 100986560 B1 | 10/2010 |
| TW | 200926449 A | 6/2009 |
| TW | 201036213 A | 10/2010 |
| WO | 2008131735 A1 | 11/2008 |

OTHER PUBLICATIONS

Office Action issued May 26, 2014 in Korean Application No. 10-2013-7018061, 12 pages.

Office Action mailed May 3, 2015 in Korea Application No. 10-2013-7018061, 19 pages.

Office Action mailed May 22, 2015 in Taiwan Application No. 100144449, 4 pages.

Office Action mailed May 26, 2015 in China Application No. 201180060637.4, 21 pages.

Office Action mailed May 27, 2016 in China Application No. 201180060637.4, 12 pages.

* cited by examiner

SOLID STATE LIGHTING DEVICES WITH ACCESSIBLE ELECTRODES AND METHODS OF MANUFACTURING

CROSS-REFERENCE TO RELATED APPLICATION

This application is a continuation of U.S. application Ser. No. 13/926,799 filed Jun. 25, 2013, which is a continuation of U.S. application Ser. No. 12/970,726 filed Dec. 16, 2010, now U.S. Pat. No. 8,476,649, which is incorporated herein by reference in its entirety.

TECHNICAL FIELD

The present disclosure is related to light emitting dies (e.g., light emitting diodes ("LEDs")) and solid state lighting ("SSL") devices with light emitting dies having accessible electrodes and methods of manufacturing.

BACKGROUND

SSL devices can have light emitting dies with different electrode configurations. For example, FIG. 1A is a cross-sectional view of a light emitting die 10 with lateral electrodes. As shown in FIG. 1A, the light emitting die 10 includes a substrate 12 carrying an LED structure 11 comprised of N-type gallium nitride (GaN) 14, GaN/indium gallium nitride (InGaN) multiple quantum wells ("MQWs") 16, and P-type GaN 18. The light emitting die 10 also includes a first electrode 20 on the N-type GaN 14 and a second electrode 22 on the P-type GaN 18. As shown in FIG. 1A, the first and second electrodes 20 and 22 are both on the front side of the LED structure 11 and readily accessible.

FIG. 1B shows a light emitting die 10' with vertical electrodes. The light emitting die 10' includes a first electrode 20 on the N-type GaN 14 and second electrode 22 under the P-type GaN 18. The light emitting die 10' can have higher degrees of current spreading between the first and second electrodes 20 and 22 than the light emitting die 10 of FIG. 1A. However, the second electrode 22 is not readily accessible because it is buried between the P-type GaN 18 and the substrate 12. In addition, the first electrode 20 partially blocks the generated light (as indicated by the arrow 15a), and thus only allows a portion of the generated light to be extracted (as indicated by the arrow 15b). Thus, the light extraction efficiency of the light emitting die 10' may be limited.

One approach for improving the light extraction efficiency of light emitting dies with vertical electrodes is by incorporating a "buried" electrode. As shown in FIG. 1C, an light emitting die 10" includes an opening 21 extending into the N-type GaN 14 from the substrate 12. An insulating material 25 lines the sidewalls 23 of the opening 21. A conductive material is disposed in the opening 21 to form the first electrode 20. The light emitting die 10" with the buried first electrode 20 can have improved light extraction efficiencies because it does not cover any portion of the N-type GaN 14. However, neither of the first and second electrodes 20 and 22 are readily accessible in this design, and they require precise alignment with external conductors to avoid electrode mismatch. Accordingly, several improvements in electrode configuration of light emitting dies may be desirable.

DETAILED DESCRIPTION

Various embodiments of light emitting dies, SSL devices with light emitting dies, and methods of manufacturing are described below. As used hereinafter, the term "SSL device" generally refers to devices with one or more solid state light emitting dies, such as LEDs, laser diodes ("LDs"), and/or other suitable sources of illumination other than electrical filaments, a plasma, or a gas. A person skilled in the relevant art will also understand that the technology may have additional embodiments, and that the technology may be practiced without several of the details of the embodiments described below with reference to FIGS. 2A-6B.

Figure 2A:
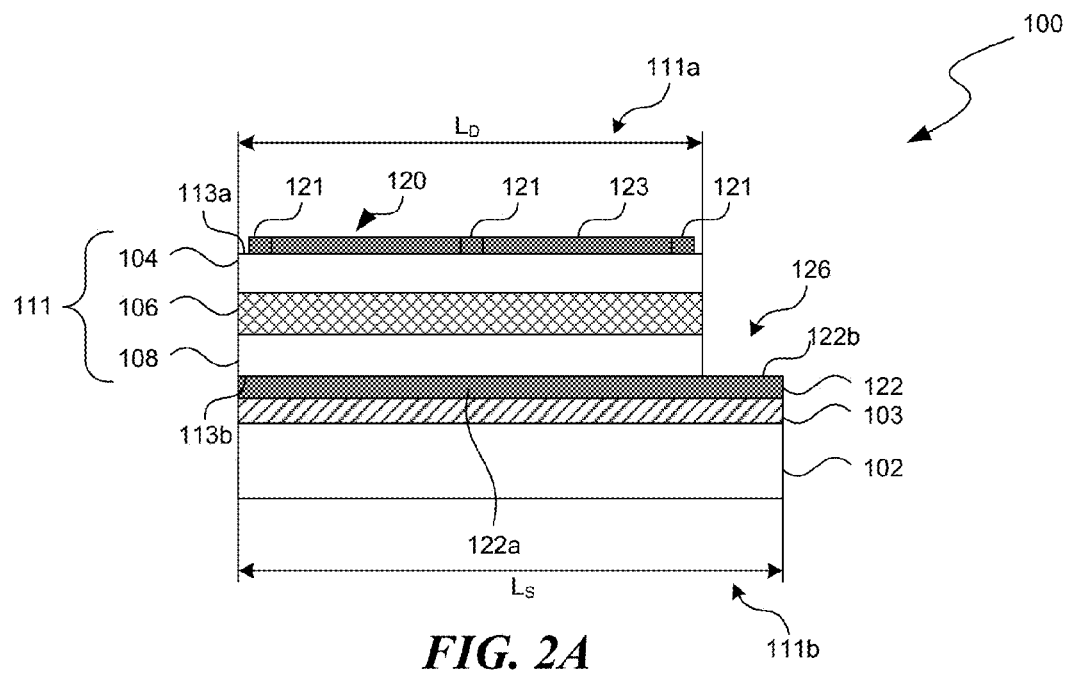
FIG. 2A is a schematic cross-sectional diagram of a light emitting die with vertical electrodes in accordance with embodiments of the present technology.
Figure 2B:
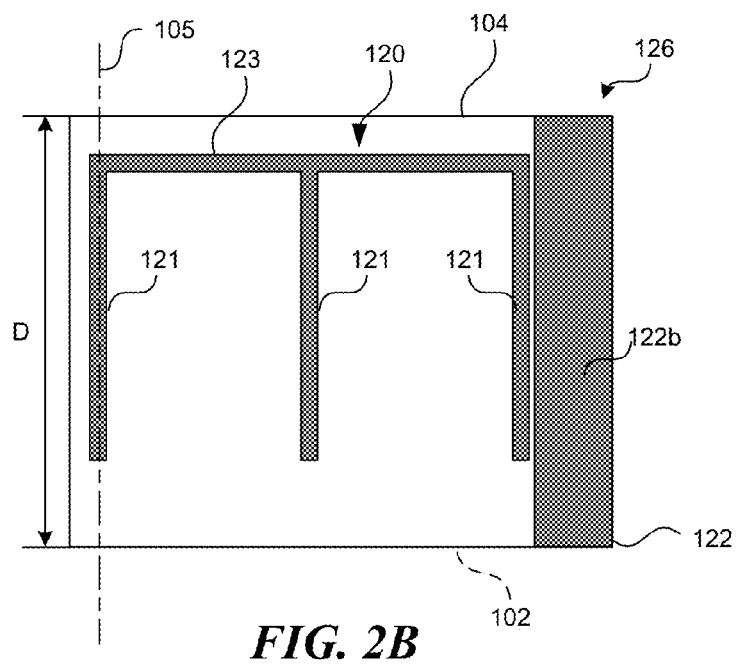
FIG. 2B is a schematic top plan view of the light emitting die shown in FIG. 2A.

FIG. 2A is a schematic cross-sectional diagram of a light emitting die 100, and FIG. 2B is a top plan view of the light emitting die 100 shown in FIG. 2A. As shown in FIG. 2A, the light emitting die 100 can include an SSL structure 111, a first electrode 120, a second electrode 122, and a substrate 102 carrying the SSL structure 111 with an insulating material 103 therebetween. Only certain components of the light emitting die 100 are shown in FIGS. 2A and 2B, and it will be appreciated that the light emitting die 100 can also include a lens, a mirror, and/or other suitable optical and/or electrical components in other embodiments.

In one embodiment, the substrate 102 can include a metal, a metal alloy, a doped silicon, and/or other electrically conductive substrate materials. For example, in one embodiment, the substrate 102 can include copper, aluminum, and/or other suitable metals. In other embodiments, the substrate 102 can also include a ceramic material, a silicon, a polysilicon, and/or other generally non-conductive substrate materials. For example, the substrate 102 can include intrinsic silicon and/or polysilicon materials. Even though only one SSL structure 111 is shown on the substrate 102, two, three, or any other desired number of SSL structure 111 may be formed on the substrate 102 in practice.

In certain embodiments, the insulating material 103 can include silicon oxide ($SiO_2$), silicon nitride ($Si_3N_4$), and/or other suitable non-conductive materials formed on the substrate 102 via thermal oxidation, chemical vapor deposition ("CVD"), atomic layer deposition ("ALD"), and/or other suitable techniques. In other embodiments, the insulating material 103 can include a polymer (e.g., polytetrafluoroethylene and/or other fluoropolymer of tetrafluoroethylene), an epoxy, and/or other polymeric materials. In one example, the polymeric materials may be configured as a preformed sheet or tape that can be attached to the substrate 102 via solid-solid bonding, adhesives, and/or other suitable techniques. In another example, the polymeric materials may be configured as a paste or a liquid that may be applied to the substrate 102 and subsequently cured. In further embodiments, the insulating material 103 may be omitted if the substrate 102 is electrically insulative.

The SSL structure 111 is configured to emit light and/or other types of electromagnetic radiation in response to an applied electrical voltage. In the illustrated embodiment, the SSL structure 111 includes a first semiconductor material 104 having a first surface 113a proximate a first side 111a of the light emitting die 100, an active region 106, and a second semiconductor material 108 having a second surface 113b proximate a second side 111b of the light emitting die 100. The SSL structure 111 has a stack thickness equal to the sum of the thicknesses of the first semiconductor material 104, the active region 106, and the second semiconductor material 108. The stack thickness of the SSL structure 111 shown in FIG. 2A, for example, is the distance between the first surface 113a and the second surface 113b. In other embodiments, the SSL structure 111 can also include silicon nitride, aluminum nitride (AlN), and/or other suitable intermediate materials.

In certain embodiments, the first semiconductor material 104 can include N-type GaN (e.g., doped with silicon (Si)), and the second semiconductor material 108 can include P-type GaN (e.g., doped with magnesium (Mg)). In other embodiments, the first semiconductor material 104 can include P-type GaN, and the second semiconductor material 108 can include N-type GaN. In further embodiments, the first and second semiconductor materials 104 and 108 can individually include at least one of gallium arsenide (GaAs), aluminum gallium arsenide (AlGaAs), gallium arsenide phosphide (GaAsP), gallium (III) phosphide (GaP), zinc selenide (ZnSe), boron nitride (BN), AlGaN, and/or other suitable semiconductor materials.

The active region 106 can include a single quantum well ("SQW"), MQWs, and/or a bulk semiconductor material. As used hereinafter, a "bulk semiconductor material" generally refers to a single grain semiconductor material (e.g., InGaN) with a thickness greater than about 10 nanometers and up to about 500 nanometers. In certain embodiments, the active region 106 can include an InGaN SQW, GaN/InGaN MQWs, and/or an InGaN bulk material. In other embodiments, the active region 106 can include aluminum gallium indium phosphide (AlGaInP), aluminum gallium indium nitride (AlGaInN), and/or other suitable materials or configurations.

In certain embodiments, at least one of the first semiconductor material 104, the active region 106, and the second semiconductor material 108 can be formed on the substrate material 102 via metal organic chemical vapor deposition ("MOCVD"), molecular beam epitaxy ("MBE"), liquid phase epitaxy ("LPE"), and hydride vapor phase epitaxy ("HVPE"). In other embodiments, at least one of the foregoing components and/or other suitable components (not shown) of the SSL structure 111 may be formed via other suitable epitaxial growth techniques.

As shown in FIGS. 2A and 2B, the first electrode 120 is spaced apart from the second electrode 122 by the vertical thickness of the entire SSL structure 111. The shortest distance between the first and second electrodes in this embodiment, therefore, is the distance from the first surface 113a to the second surface 113b. In the illustrated embodiment, the first electrode 120 includes a plurality of electrode fingers 121 (three are shown for illustration purposes) coupled to one another by a cross member 123. The electrode fingers 121 extend generally parallel to an axis 105 (FIG. 2B) of the SSL structure 111, and the cross member 123 is generally perpendicular to the electrode fingers 121. In certain embodiments, the electrode fingers 121 and/or the cross member 123 can include indium tin oxide ("ITO"), aluminum zinc oxide ("AZO"), fluorine-doped tin oxide ("FTO"), and/or other suitable transparent conductive oxides ("TCOs"). In other embodiments, the electrode fingers 121 and/or the cross member 123 can include copper (Cu), aluminum (Al), silver (Ag), gold (Au), platinum (Pt), and/or other suitable metals. In further embodiments, the electrode fingers 121 and/or the cross member 123 can include a combination of TCOs and one or more metals. Techniques for forming the electrode fingers 121 and/or the cross member 123 can include MOCVD, MBE, spray pyrolysis, pulsed laser deposition, sputtering, electroplating, and/or other suitable deposition techniques.

The second electrode 122 can include a reflective and conductive material (e.g., silver or aluminum), at least a portion of which can be exposed through the SSL structure 111. For example, as shown in FIGS. 2A and 2B, the second electrode 122 includes a covered first portion 122a and an exposed second portion 122b laterally extending beyond the SSL structure 111. As a result, the exposed second portion 122b can form a connection site 126 for interconnecting with external components (not shown) via a wirebond and/or other suitable couplers.

During manufacturing, in certain embodiments, the substrate 102 may be selected to have a first lateral dimension $L_S$ greater than a second lateral dimension $L_D$ of the SSL structure 111. The insulating material 103 and the second electrode 122 (e.g., aluminum, silver, or other reflective and conductive materials) can then be formed on the substrate 102 in sequence. In one embodiment, the SSL structure 111 may be attached to the second electrode 122 on the substrate 102 via solid-solid bonding (e.g., copper-copper bonding, nickel-tin bonding, and gold-tin bonding) between the second electrode 122 and the second semiconductor material 108. In another embodiment, a bonding material (e.g., gold-tin, not shown) may be formed on the second semiconductor material 108. In yet another embodiment, a reflective material (e.g., silver, not shown) may be formed on the second semiconductor material 108 before forming the bonding material. The SSL structure 111 can then be bonded to the substrate 102 via solid-solid bonding between the second electrode 122 and the bonding material. In further embodiments, the SSL structure 111 may be attached to the substrate 102 via other suitable mechanisms.

In other embodiments, the substrate 102 may be selected to have a first lateral dimension $L_S$ that is generally the same as the lateral dimension $L_D$ of the SSL structure 111. After attaching the SSL structure 111 to the substrate 102, a portion of the SSL structure 111 may be removed to form the exposed second portion 122b of the second electrode 122.

Techniques for removing a portion of the SSL structure 111 can include partial dicing (e.g., with a die saw), laser ablation, wet etching, dry etching, and/or other suitable technique. In further embodiments, the partially exposed second electrode 122 may be formed via other suitable techniques.

Figure 1A:
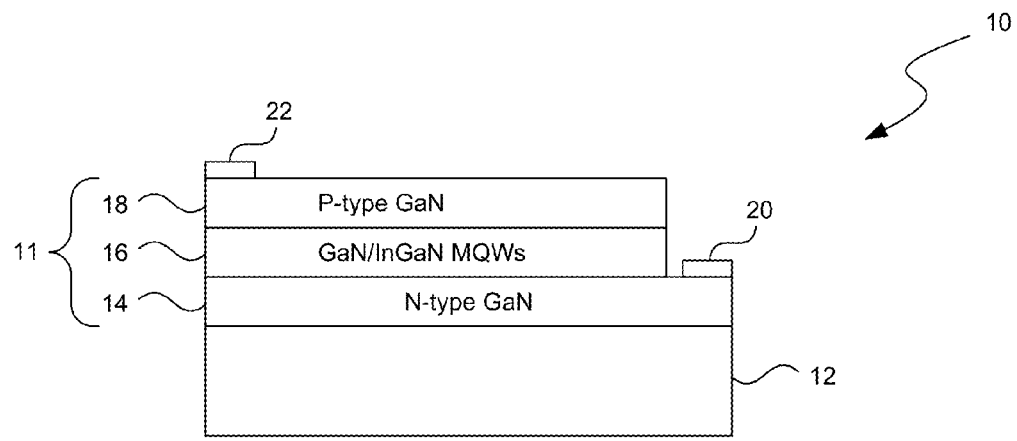
FIG. 1A is a schematic cross-sectional diagram of a light emitting die with lateral electrodes in accordance with the prior art.
Figure 1B:
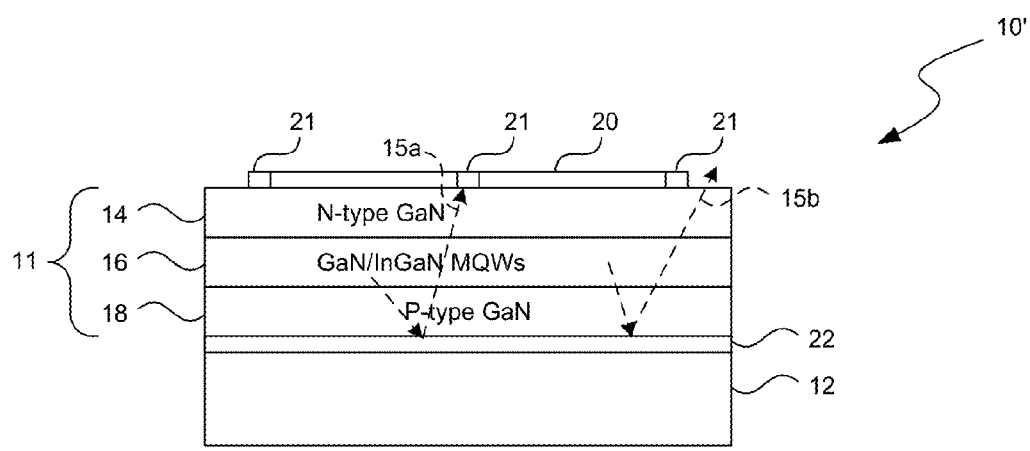
FIG. 1B is a schematic cross-sectional diagram of a light emitting die with vertical electrodes in accordance with the prior art.
Figure 1C:
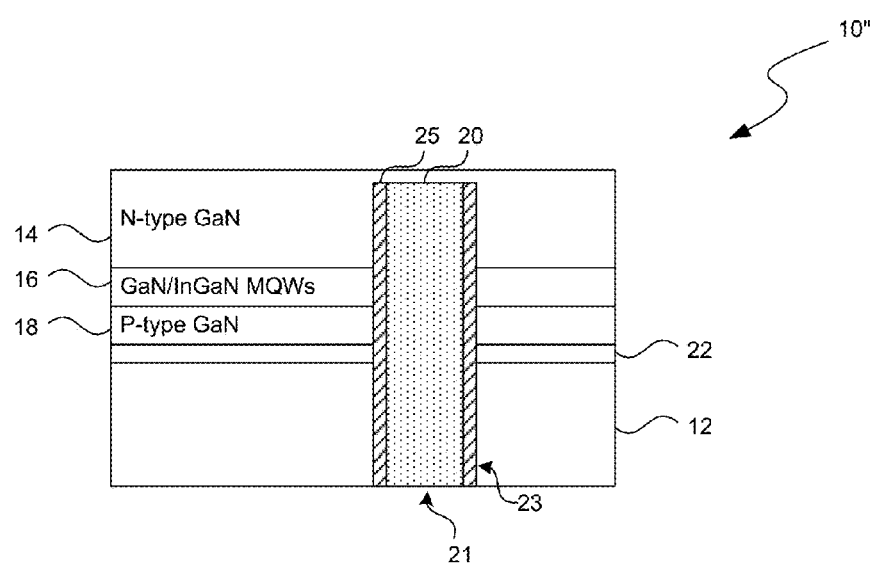
FIG. 1C is a schematic cross-sectional diagram of a light emitting die with a buried electrode in accordance with the prior art.

Several embodiments of the light emitting die 100 can have the connection accessibility of the light emitting die 10 of FIG. 1A with current spreading characteristics generally similar to that of the light emitting die 10' of FIG. 1B. As shown in FIGS. 2A and 2B, the exposed second portion 122b of the second electrode 122 provides ready access for external connection. As a result, both the first electrode 120 and the second electrode 122 can be accessed from the same side (i.e., the first side 111a) of the SSL structure 111. Meanwhile, the covered first portion 122a of the second electrode 122 is arranged vertically across the SSL structure 111 with respect to the first electrode 120, and thus providing better current distribution through the SSL structure 111 compared to the lateral device in FIG. 1A. As a result, several embodiments of the light emitting die 100 can operate with high efficiency while providing the connection accessibility of the light emitting die 10 of FIG. 1A.

Figure 3A:
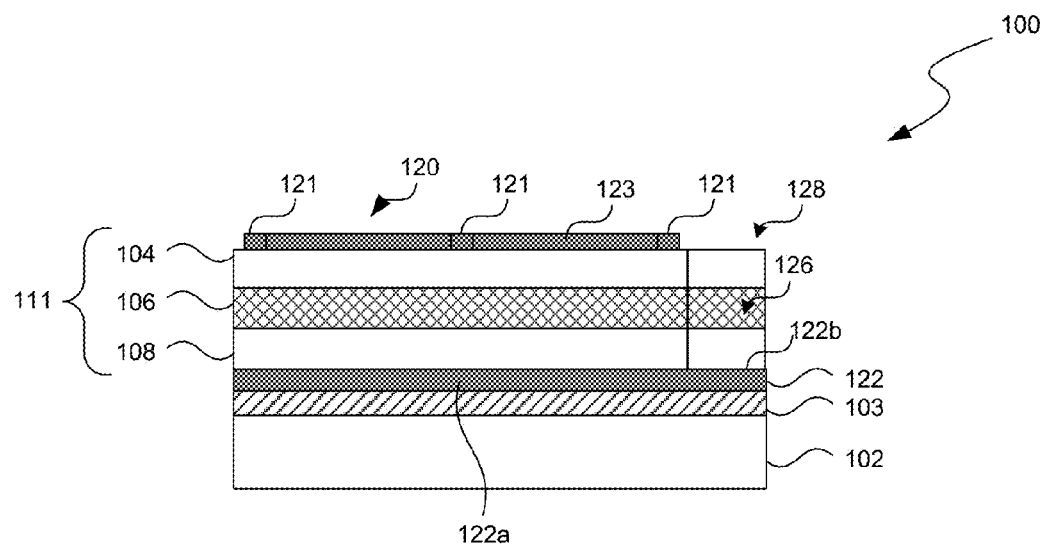
FIG. 3A is a schematic cross-sectional diagram of a light emitting die with a buried electrode in accordance with embodiments of the present technology.
Figure 3B:
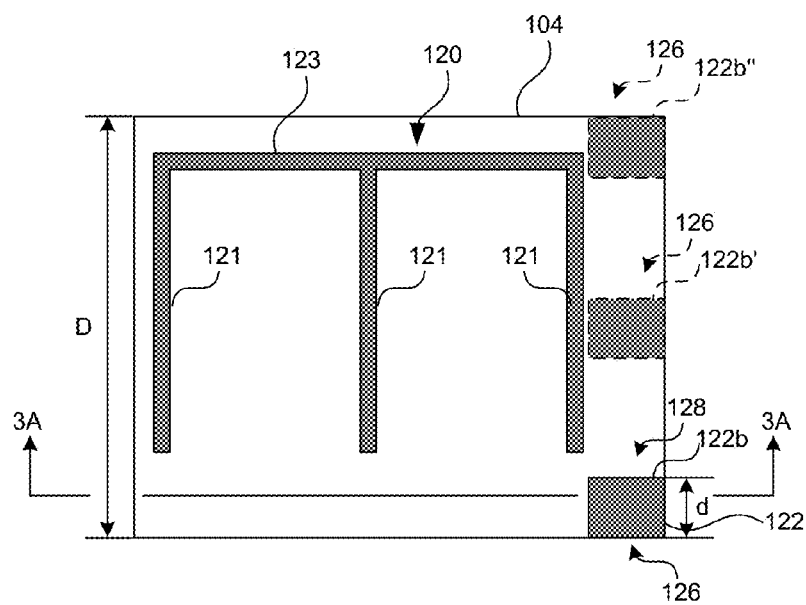
FIG. 3B is a schematic top plan view of the light emitting die shown in FIG. 3A.

Even though the exposed second portion 122b of the second electrode 122 is shown in FIG. 2B as extending substantially the entire depth D (FIG. 2B) of the SSL structure 111 along the axis 105, in other embodiments the second portion 122b may extend only partially along the axis 105 of the SSL structure 111. For example, as shown in FIGS. 3A and 3B, the second portion 122b may be exposed through a notch 128 in the SSL structure 111 formed on the substrate 102 with the insulating material 103. The notch 128 has a depth d (FIG. 3B) that is less than the depth D (FIG. 2B) of the SSL structure 111. In other embodiments, the second portion 122b may also include a plurality of individual sections spaced apart from one another. For example, three sections (identified individually as first, second, and third sections 122b, 122b', and 122b'') are shown in FIG. 3B for illustration purposes. Each of the three sections 122b, 122b', and 122b'' may form a connection site 126 for connecting to an external component (not shown). As a result, the light emitting die 100 can provide a plurality of connection sites 126 to receive/transmit signals and/or power to/from more than one component. In further embodiments, the insulating material 103 may be omitted from the light emitting die 100.

Figure 4:
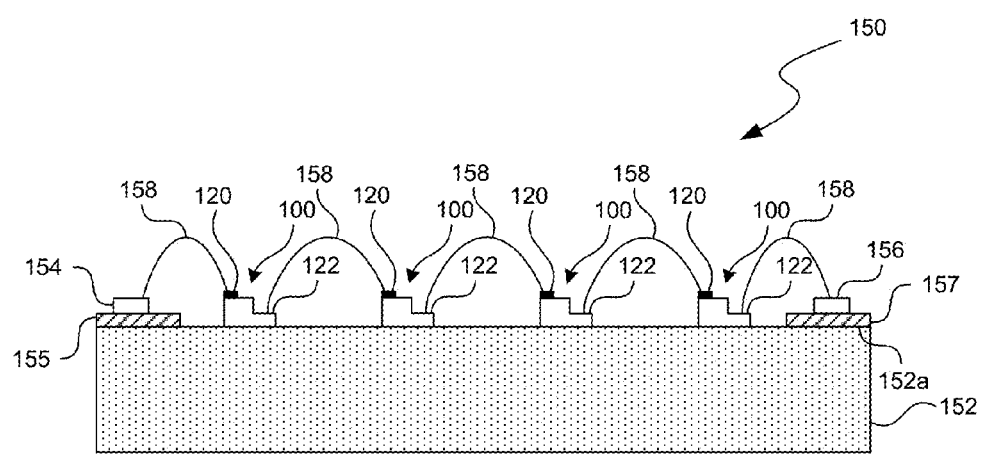
FIG. 4 is a schematic illustration of an SSL device incorporating the light emitting dies of FIGS. 2A-3B in accordance with embodiments of the present technology.

Several embodiments of the light emitting die 100 can be packaged in an SSL device with improved thermal dissipation characteristics over conventional devices. For example, FIG. 4 is a schematic illustration of an SSL device 150 incorporating the light emitting dies 100 of FIGS. 2A-3B in accordance with embodiments of the present technology. As shown in FIG. 4, the SSL device 150 can include a carrier 152 carrying a plurality of light emitting dies 100. Four light emitting dies 100 are shown in FIG. 4 for illustration purposes. In other embodiments, the SSL device 150 can include any other desired number of light emitting dies 100.

The carrier 152 can include a metal, a metal alloy, and/or other types of thermally conductively structure. The SSL assembly 150 can also include a first terminal 154 laterally spaced apart from a second terminal 156 on the carrier 152. The first and second terminals 154 and 156 are formed on insulative pads 155 and 157, respectively. The insulative pads 155 and 157 can include silicon oxide, silicon nitride, and/or other suitable types of electrically insulative materials.

As shown in FIG. 4, the first terminal 154, the plurality of light emitting dies 100, and the second terminal 156 are electrically coupled with wirebonds 158 in series because the first and second electrodes 120 and 122 are both on the front side of the individual light emitting dies 100. As a result, the back side of the light emitting dies 100 can directly contact the surface 152a of the carrier 152. In operation, such direct contact allows the light emitting dies 100 to readily transfer heat to the thermally conductive carrier 152, and thus efficiently dissipate heat away from the light emitting dies 100.

Figure 5A:
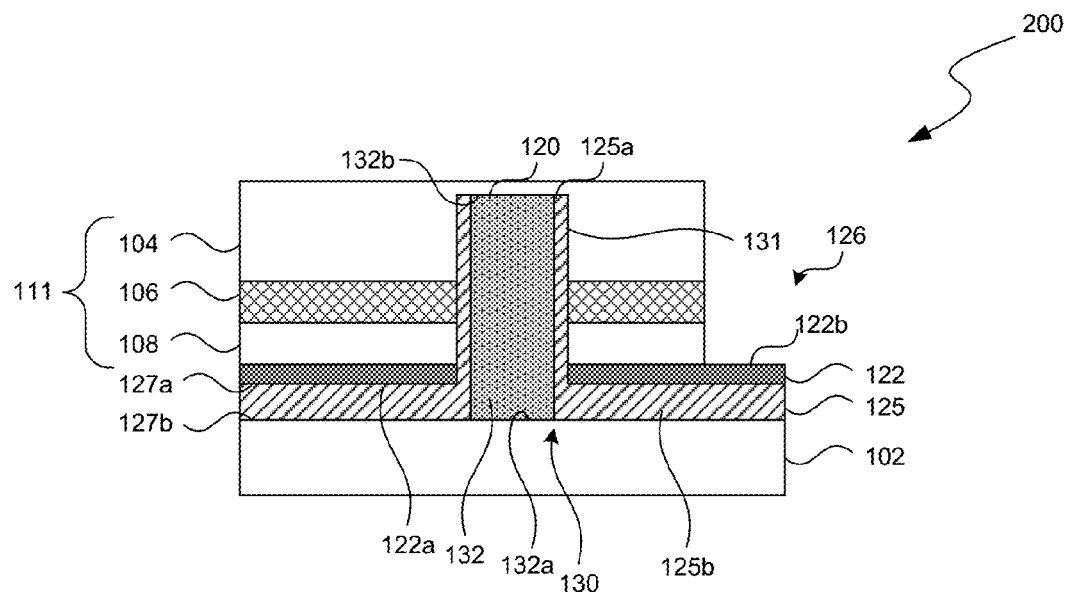
FIG. 5A is a schematic cross-sectional diagram of a light emitting die with a buried electrode in accordance with embodiments of the present technology.
Figure 5B:
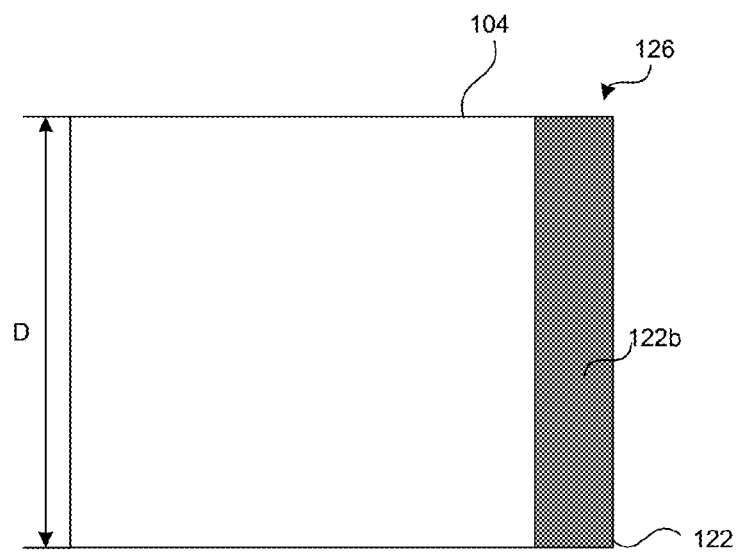
FIG. 5B is a schematic top plan view of the light emitting die shown in FIG. 5A.

FIG. 5A is a schematic cross-sectional diagram of an light emitting die 200 with a buried electrode in accordance with another embodiment of the technology, and FIG. 5B is a top plan view of the light emitting die 200 in FIG. 5A. The light emitting die 200 can include components that are generally similar in structure and function as those of the light emitting die 100 in FIGS. 2A-3B. For example, the light emitting die 200 can include the substrate 102 carrying the SSL structure 111 and the exposed second electrode 122 that are generally similar to those discussed above with reference to FIGS. 2A-3B. As such, common acts and structures are identified by the same reference numbers, and only significant differences in operation and structure are described below.

As shown in FIG. 5A, the SSL structure 111 includes a plurality of openings 130 (only one is shown in FIG. 5A after it has been filled for clarity) extending from the second electrode 122 into the first semiconductor material 104 of the SSL structure 111. A passivation material 125 (e.g., silicon oxide or silicon nitride) has a first portion 125a in the opening 130 and a second portion 125b external to the opening 130. The first portion 125a generally conforms to the sidewall 131 of the opening 130 and forms a dielectric liner. The second portion 125b has a first surface 127a in contact with the second electrode 122 and a second surface 127b in contact with the substrate 102.

The first electrode 120 can include a conductive material 132 adjacent the passivation material 125 in the opening 130. In the illustrated embodiment, the conductive material 132 has a first end 132a that is generally co-planar with the passivation material 125 such that the first end 132a of the conductive material 132 is in direct contact with the substrate 102. The conductive material 132 also includes a second end 132b in contact with the first semiconductor material 104. As a result, the conductive material 132 electrically couples the first semiconductor material 104 to the substrate 102.

Several embodiments of the light emitting die 200 can have more accessible electrical connections than conventional buried electrode devices. For example, as shown in FIG. 5A, the first electrode 120 is electrically coupled to the substrate 102. As a result, in certain embodiments, the substrate 102 may be electrically conductive and used as a connection site/path to electrically couple external components (not shown). Thus, precise alignment with external conductors may be avoided to reduce production complexity and costs.

Figure 5C:
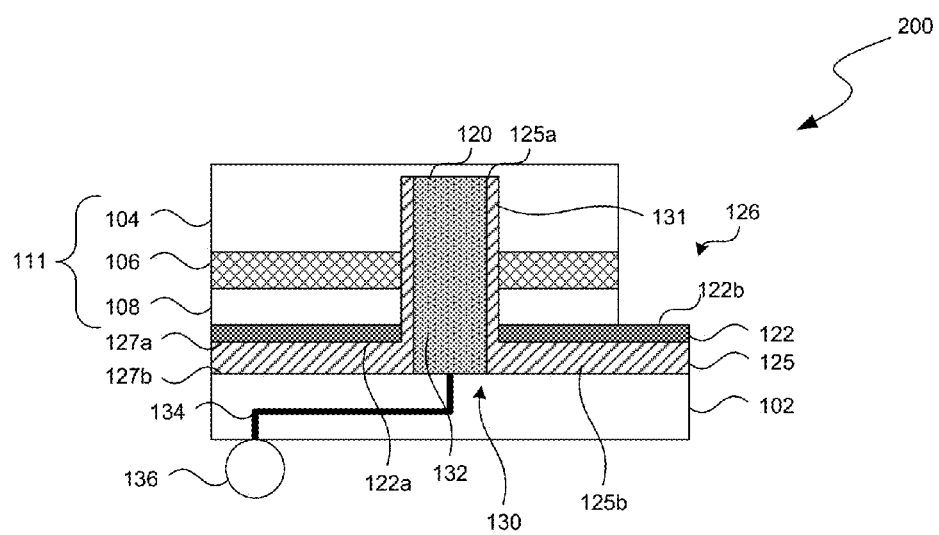
FIG. 5C is a schematic cross-sectional diagram of a light emitting die with a buried electrode in accordance with embodiments of the present technology.

In other embodiments, the substrate 102 may be electrically insulative and may include signal routing components (e.g., metal routing layers 134) that route the individual first electrodes 120 to respectively electrical couplers 136 (e.g., solder bumps, solder balls, and/or pillar bumps), as shown in FIG. 5C. In further embodiments, the substrate 102 may be partially electrical conductive and partially electrically insulative. In yet further embodiments, the light emitting die 200 may include other suitable configurations, as discussed in more detail below with reference to FIGS. 6A and 6B.

Figure 6A:
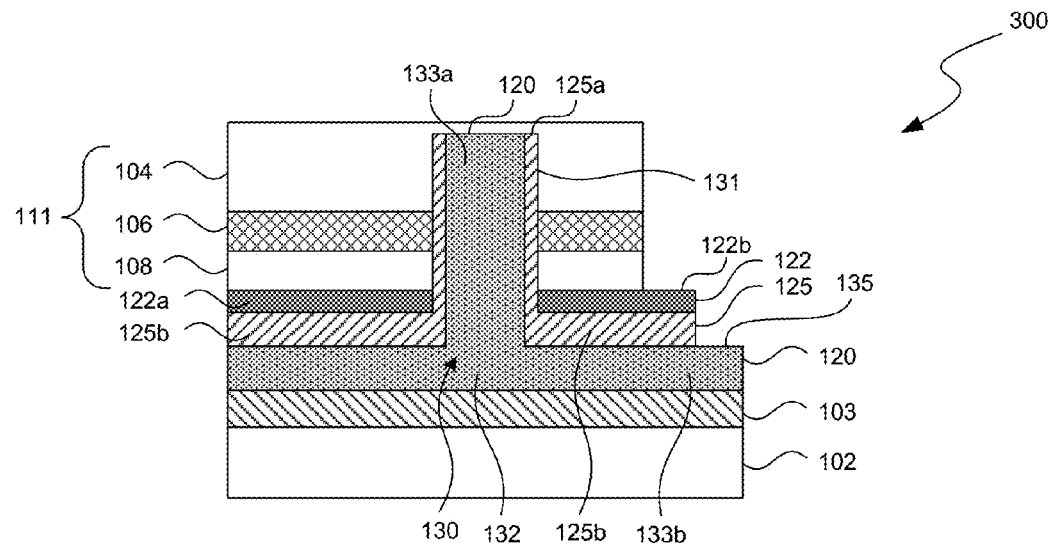
FIG. 6A is a schematic cross-sectional diagram of a light emitting die with a buried electrode in accordance with additional embodiments of the present technology.
Figure 6B:
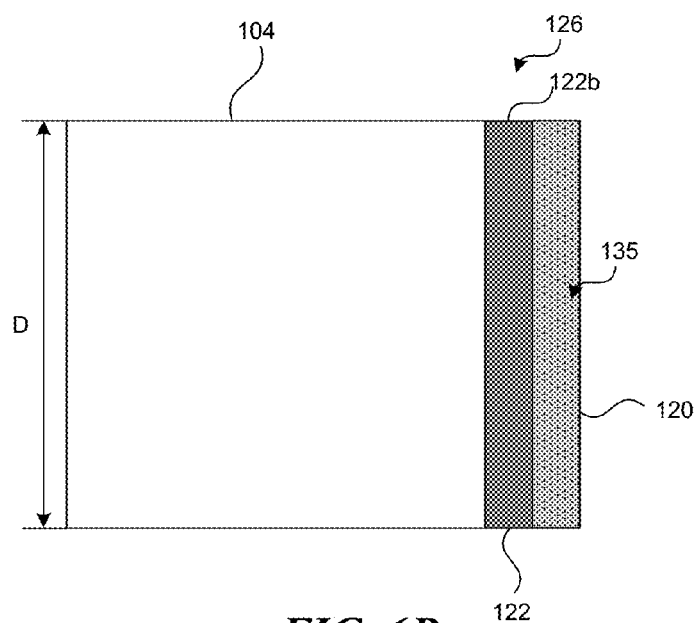
FIG. 6B is a schematic top plan view of the light emitting die shown in FIG. 6A.

FIG. 6A is a schematic cross-sectional diagram of a light emitting die 300 with a buried electrode, and FIG. 6B is a schematic top plan view of the light emitting die 300 shown in FIG. 6A. As shown in FIG. 6A, the light emitting die 300 includes the substrate 102, the insulating material 103 on the substrate 102, and the SSL structure 111 with exposed first and second electrodes 120 and 122. The second electrode 122 can be generally similar to that discussed above with reference to FIG. 5A. In other embodiments, the insulating material 103 may be omitted.

The first electrode 120 includes the conductive material 132. A first part 133a of the conductive material 132 is adjacent the passivation material 125 in the opening 130. A second part 133b of the conductive material 132 is external to the opening 130. In the illustrated embodiment, a portion of the second part 133b laterally extends beyond the second portion 125b of the passivation material 125 and the second portion 122b of the second electrode 122. As a result, the second part 133b of the conductive material 132 (generally designated as connection area 135) is at least partially exposed through the SSL structure 111. In other embodiments, the second portion 122b of the second electrode 122 may be laterally opposite and/or having other arrangements relative to the connection area 135. In further embodiments, the conductive material 132 may include a stack of a plurality of conductive materials (not shown). As shown in FIG. 6B, both the first and second electrodes 120 and 122 are accessible from the same side of the SSL structure 111.

Even though the light emitting dies 200 and 300 shown in FIGS. 5B and 6B include first and/or second electrodes 120 and 122 extending the entire depth D of the substrate 102, in other embodiments, the first and/or second electrodes 120 and 122 may also extend a partial depth D of the substrate 102, generally similar to the light emitting die 100 discussed above with reference to FIG. 3B. In further embodiments, the first and/or second electrodes 120 and 122 may include a plurality of electrode elements (not shown).

From the foregoing, it will be appreciated that specific embodiments of the technology have been described herein for purposes of illustration, but that various modifications may be made without deviating from the disclosure. In addition, many of the elements of one embodiment may be combined with other embodiments in addition to or in lieu of the elements of the other embodiments. Accordingly, the disclosure is not limited except as by the appended claims.

We claim:

1. A light emitting die, comprising:
   a first semiconductor material having a first surface;
   a second semiconductor material having a second surface facing away from the first surface of the first semiconductor material;
   an active region between the first and second semiconductor materials, wherein the first semiconductor material, the active region, and the second semiconductor material together have a stack thickness equal to a distance between the first and second surfaces;
   a first electrode in contact with the first surface of the first semiconductor material;
   a second electrode in contact with the second surface of the second semiconductor material, the second electrode being spaced apart from the first electrode by at least the stack thickness; and
   wherein a portion of the second electrode is exposed through the first semiconductor material, the active region, and the second semiconductor material.

2. The light emitting die of claim 1 wherein both the first electrode and the second electrode are accessible from the same side of the light emitting die.

3. The light emitting die of claim 1 wherein:
   the second electrode includes a first portion and a second portion extending from the first portion;
   the first portion of the second electrode is covered by the first semiconductor material, the active region, and the second semiconductor material; and
   the second portion of the second electrode is exposed through the first semiconductor material, the active region, and the second semiconductor material.

4. The light emitting die of claim 1 wherein:
   the second electrode includes a first portion and a second portion extending from the first portion;
   the first portion of the second electrode is covered by the first semiconductor material, the active region, and the second semiconductor material; and
   the second portion of the second electrode laterally extends beyond the second semiconductor material, the active region, and the first semiconductor material.

5. The light emitting die of claim 1 wherein:
   the second electrode includes a first portion and a second portion extending from the first portion;
   the first portion of the second electrode is covered by the first semiconductor material, the active region, and the second semiconductor material;
   the second portion of the second electrode includes a plurality of individual sections spaced apart from one another; and
   the individual sections of the second portion laterally extend beyond the first semiconductor material, the active region, and the second semiconductor material.

6. The light emitting die of claim 1 wherein the exposed portion of the second electrode forms a connection site configured to directly connect to external components.

7. The light emitting die of claim 1 wherein the second electrode has a connection site that is vertically aligned with the second surface of the second semiconductor material.

8. The light emitting die of claim 1, further including a substrate, wherein the first semiconductor material is between the substrate and the first electrode.

9. The light emitting die of claim 1, further including a conductive substrate, wherein the first semiconductor material is between the conductive substrate and the first electrode.

10. The light emitting die of claim 1, further including a substrate and an insulating material on the substrate, wherein the insulating material is between the substrate and the second semiconductor material.

11. The light emitting die of claim 1, further including a reflective material adjacent the second surface of the second semiconductor material.

12. The light emitting die of claim 1, further including a substrate and a reflective material between the substrate and the second semiconductor material.

* * * * *